United States Patent [19]
Murphy

[11] Patent Number: 6,157,257
[45] Date of Patent: Dec. 5, 2000

[54] LOW POWER FOLDING AMPLIFIER

[75] Inventor: Anna Murphy, Cannes, France

[73] Assignee: Conexant Systems, Inc., Newport Beach, Calif.

[21] Appl. No.: 09/340,255

[22] Filed: Jun. 30, 1999

[51] Int. Cl.$^7$ ....................................................... H03F 3/45
[52] U.S. Cl. ............................ 330/252; 330/51; 330/295; 330/253; 330/261
[58] Field of Search ..................................... 341/156, 158, 341/159; 330/51, 252, 253, 261, 295

[56] References Cited

U.S. PATENT DOCUMENTS 5,045,804   9/1991   Sugawara et al. ......................... 330/51

*Primary Examiner*—Michael B Shingleton
*Attorney, Agent, or Firm*—Snell & Wilmer L.L.P.

[57] ABSTRACT

A folding amplifier in which a single tail current is used to service all differentially coupled transistor pairs in the amplifier. The input signal applied to each differential pair of transistors is used to drive a switch which controls the tail current to that specific differential pair. When a differential pair is fully switched in either direction, the associated tail current switch is open. As the input signal applied to the differential pair causes the pair to pass through its active region, the switch associated with that pair closes to allow current to be conducted through that pair. Therefore, the tail current has a path which is primarily through a single differential pair at any given time.

18 Claims, 4 Drawing Sheets

LOW POWER FOLDING AMPLIFIER

FIELD OF THE INVENTION

This invention relates generally to electronic signal processing, and more particularly, to a folding-type amplifier used in analog to digital converters.

STATEMENT OF THE PROBLEM

Folding amplifiers are most commonly used for performing the initial analog processing to reduce the number of comparators in certain types of analog to digital (A/D) converters. Therefore, the performance of an A/D converter which employs folding amplifiers is limited by the performance of the folding amplifier design. Because of the widespread use of A/D converters, this section of the present document evaluates the characteristics of folding amplifiers in the context of A/D converters.

An A/D converter is a device which converts an analog input signal into a binary number proportional to the amplitude of the analog signal. A typical A/D converter generates a transfer function that divides an analog signal into a plurality of amplitude levels and produces digital codes of n-bit length representing the respective amplitude levels of the analog signal.

Numerous methods exist for performing the analog to digital conversion. A "flash" A/D converter is one of the fastest presently-known A/D converter architectures, and utilizes a set of comparators operating in parallel, each comparing the analog input signal to a different reference voltage. If the amplitude of the analog input signal is greater than the reference level, the output of the comparator will be in a high logic state: conversely, if the amplitude of the analog input signal is less than the reference level, the output of the comparator will be in a low logic state. The output of each comparator is latched and the signals at all of the outputs are sent simultaneously to a decoder, the output of which is the desired digital representation of the analog input at a particular point in time.

In order to obtain a digital output having N bits, a flash converter requires ($2^N-1$) comparators, latches and reference voltage levels. The reference levels are generally established through the use of precision resistors connected in series. The tap between two adjacent resistors is connected to one input of a comparator and the other input of the comparator receives the analog input signal.

Even through the only significant information is contained at the point of transition between a comparator which is on and the comparator above it which is off, many more comparators may be in a high logic state and an equal number of latches will be latched leading to unnecessary use of circuit elements and power. Furthermore, a decoder is necessary to convert the output of the comparators into useful binary information. Consequently, despite its high speed parallel operation, a flash A/D converter may become prohibitively expensive in terms of cost, number of parts (comparators, latches, decoder and resistor string), power consumed and space required when resolution greater than about 8 bits is required.

A 'folding' A/D converter is one type of well-known A/D converter that is used in many systems requiring high-speed signal conversion. The use of folding amplifiers enables a folding A/D converter to achieve the speed of a flash A/D converter while reducing the number of components required with a commensurate reduction in power consumption. A folding A/D converter typically employs a number of folding amplifier stages to process an analog input signal by generating a transfer function which divides the input signal range into a number of linear segments. A folding A/D converter processes "fine bits" and "coarse bits" in parallel. The folding amplifier takes the input signal, divides the input range into X segments (where $2^a=X$, and a is the number of coarse bits), and maps all X ranges onto one range. All coarse information is thus lost at this point. The resulting signal is then processed to find the fine-bit information. The fine-bit information can be found either by employing a flash converter using (Y−1) fine voltage references and (Y−1) comparators (where $2^b=Y$ and b is the number of fine bits, and n=a+b is the total number of bits for the A/D conversion), or by employing Y-times-interpolation and then using Y comparators. In either method, only $2^b$ comparators are needed instead of $2^{(a+b)}$. The coarse-bit information is derived in parallel, by determining which of the X segments contains the input. This requires 6 extra comparators. Therefore, the A/D conversion process requires only relatively few (typically $2^b+6$) comparators (and some combinational logic) if a folding amplifier is used. The number of fine bits that can be resolved is determined by the resolution achievable in the linear section of the output of the folding amplifier.

In one common type of folding converter, a given linear segment of the transfer function is generated and repeated for a bit of given significance by utilizing transconductance amplifiers, each of which responds to an input analog voltage input signal. A given differential pair of amplifiers is connected such that as the input voltage signal passes through a range of V volts, an output current is produced corresponding to the linear segment. By connecting a number of these differential pairs of amplifiers in a cross-coupled fashion, segment folding or repeating is obtained in increments of V volts. The resulting output currents of these differential pairs of amplifiers, representing the repeating segments of the transfer function for a given bit, are then converted to a voltage and fed to the fine bit processing section of the A/D converter.

A folding A/D converter has certain drawbacks including the fact that the folding circuit uses differential transistor pairs whose outputs are non-linear for large signal excursions. A resulting disadvantage is that at the upper and lower ends of the input range, the non-linearities may occur due to incomplete switching of certain of the differential pairs in the folding circuit. Because of the non-ideal nature of the differential pairs, the output of the folding circuit tends to resemble a rounded triangular wave or a sinusoid rather than a perfect triangular wave. At the extreme values of the sinusoid (peak and trough) the output of the folding circuit may be nearly constant even though the input is changing. This rounding off of the ideal triangular waveform results in lower resolution of the folding circuit output.

One method for reducing the errors caused by rounding at the peaks and troughs of the folding circuit output is the use of two folding circuits or "sides", whose inputs connect to alternate reference ladder taps and whose outputs are offset from each other in voltage phase (for example, by 90°), together with additional circuitry which selects one or the other side depending on which is in a linear range. Thus, before the output of the first folding side leaves its linear range, the output of the second folding side enters its linear range and is selected for processing by the fine converter.

Each differential pair in previously existing folding amplifier designs has an individual tail current source. This leads to F equal tail currents (where F is the number of differential pairs), even though most differential pairs are fully switched at any one time, and therefore contributing nothing but dc to the output. This situation is very current-inefficient. In addition, the large dc-to-signal ratio may pose headroom problems. Subtracting out the excess dc current can lead to large input-referred offsets. Finally, mismatches in the tail current sources cause differences in the gain of each pair, thus producing an uneven transfer function. This effect results in errors that appear as random offsets in the A/D converter output.

SOLUTION TO THE PROBLEM

The present invention overcomes the foregoing problems and achieves an advance in the art by providing a folding amplifier in which a single tail current is used to service all differentially coupled transistor pairs in the amplifier. The input signal to each differential pair of transistors is used to switch the tail current to that specific differential pair. When a differential pair is fully switched in either direction, the connection is open. As the differential pair passes through its active region, the switch associated to that pair closes to allow current to be conducted through that pair. At the two extremes of the signal range, the end differential pairs are switched differently; as the input signal passes out of range, the end pair continues to receive tail current. Therefore the current always has a path through the amplifier.

The folding amplifier of the present invention provides a number of advantages over the prior art. Since only one tail current is used, the present amplifier has a relatively low power consumption. For example, a four-stage folding amplifier of the design disclosed herein requires only 25 percent of the power consumed by a prior art four-stage folding amplifier. Advantageously, as the number of stages, or 'folds' in is increased, the present amplifier becomes relatively even more efficient. In a 10 stage folding amplifier, for example, the present design has a power consumption of only 10 percent of that of the prior art folding amplifiers.

Furthermore, the use of only a single tail current precludes offset errors due to tail current mismatches. In addition, since the present amplifier requires no DC current subtraction, there is no resulting input-referred offset error since no dc offset subtraction is applied to the circuit. Finally, because the present folding amplifier operates with a much lower dc current in the load, its performance does not suffer from headroom problems associated with prior art folding amplifiers.

BRIEF DESCRIPTION OF THE DRAWING

The invention may be better understood from a reading of the following description thereof taken in conjunction with the drawing in which.

DETAILED DESCRIPTION

Figure 1:
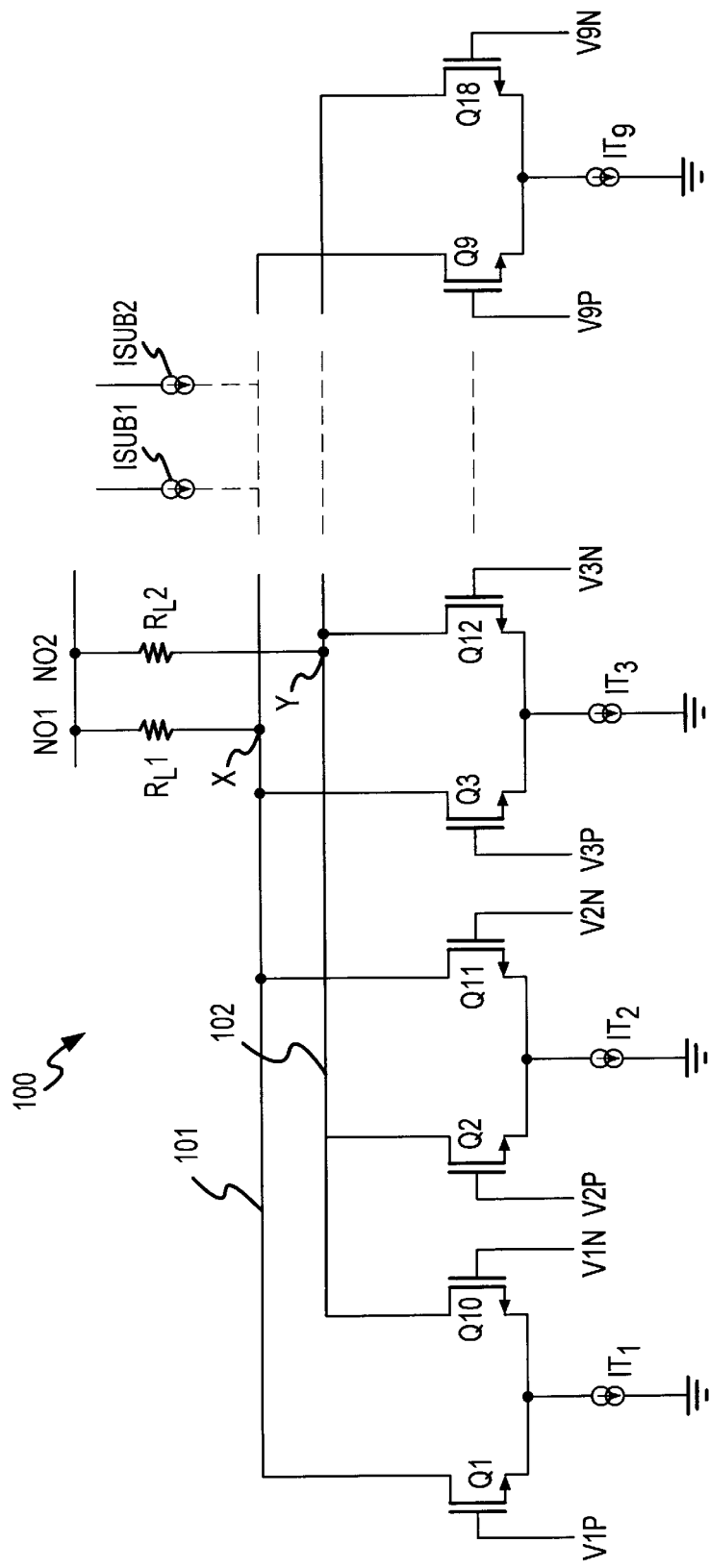
FIG. 1 is a schematic diagram illustrating a prior art folding amplifier.

FIG. 1 is a schematic diagram illustrating a prior art folding amplifier 100. In order to explain the operation of the basic folding amplifier shown in FIG. 1, the input/output characteristics of the basic circuit 100 are first described. The inputs to a folding amplifier are generally either in the form of one input signal and F reference voltages; or F differential inputs of the form VnP, VnN=$\pm(V_{in}-Vref_n)$, where $V_{in}$ is the input signal, and $Vref_n$ is the reference voltage signal for a given differential transistor pair (Q1/Q10 . . . Q9/Q18), where n=1 . . . F. The folding amplifier circuit 100 shown in FIG. 1 (as well as the other folding circuits described herein) employs differential inputs which are generated by pre-processing circuitry (not shown) well-known in the art. As shown in FIG. 1, nine differential transistor pairs (hereinafter 'differential pairs') Q1/Q10–Q9/Q18, which function as transconductance amplifiers, process the difference between $V_xP$ and $V_xN$ to produce output currents which are summed at nodes X and Y.

Each differential pair Q1/Q10–Q9/Q18 includes a first transistor having a gate electrode coupled to one side, VnP, of a differential input, and a second transistor having a gate electrode coupled to the other side, VnN, of the differential input. The drain electrode of the first transistor Q1-Q9 of each consecutive differential pair is coupled alternately to the first summing node X and the second summing node Y. The drain electrode of the second transistor Q10-Q18 of each consecutive differential pair is coupled alternately to the second summing node Y and the first summing node X. The source electrodes of the first and second transistors in each consecutive differential pair are interconnected and coupled to an individual tail current source $IT_n$.

Figure 2:
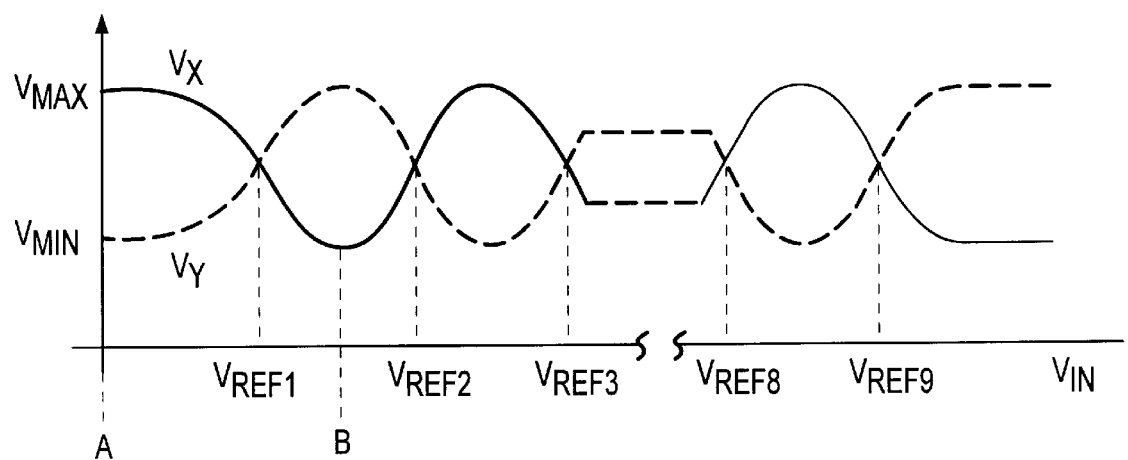
FIG. 2 is a graph showing a transfer function of a typical folding amplifier.

FIG. 2 illustrates the transfer function of the folding amplifier 100 of FIG. 1, showing the folding characteristic of this type of amplifier. The outputs of adjacent differential pairs, or stages, are added with opposite polarity to generate signals $V_x$ and $V_y$. Signals $V_x$ and $V_y$ can be seen to cross at points $Vref_1$, $Vref_2$, . . . $Vref_9$, thus folding the differential output signal $V_x$-$V_y$ nine times.

With respect to folding amplifier 100, for a value of $V_1P$ substantially lower than $V_1N$, Q1-Q9 are in an OFF state, Q10-Q18 are in an ON state, and $I_1$, $I_3$, $I_5$, $I_7$, and $I_9$ flow through $R_L1$, and $I_2$, $I_4$, $I_6$, and $I_8$ flow through $R_L2$. This condition is shown at $V_{in}$=A in FIG. 2. Load resistors $R_L1$ and $R_L2$ serve as current to voltage converters, providing output signals at nodes $N_o1$ and $N_o2$, respectively. As $V_1P$ increases relative to $V_1N$, Q1 begins to turn on, while Q2 through Q9 remain off. For $V_1P$=$V_1N$, Q1 and Q10 share $IT_1$ equally, yielding $V_x$=$V_y$, as shown at $V_{in}$=$Vref_1$. As $V_1P$ sufficiently exceeds $V_1N$, Q10 turns off, allowing $V_x$ to reach its minimum value, at $V_{in}$=B. As $V_{in}$ approaches $Vref_2$, Q2 begins to turn on, and the circuit behaves in a manner similar to that described above.

Folding amplifier circuit 100 includes optional current sources Isub1 and Isub2, which are applied to lines 101 and 102, respectively, to provide dc current subtraction. Although this current subtraction method enables circuit 100 to operate with lower headroom, the offset in the two current sources Isub1 and Isub2 referred back to the active differential pair produces a proportionally large input-referred offset.

In the folding amplifier 100 of FIG. 1, each differential pair Q1/Q10–Q9/Q18 has an individual tail current source, $IT_1$–$IT_9$. This configuration results in F equal tail currents, even though most of the differential pairs are fully switched at any one time, and therefore contribute only dc to the output. It can be seen that such a configuration is inefficient with respect to current consumption. In addition, mismatches between tail current sources $IT_1$–$IT_9$ cause differences in the gains of each differential pair Q1/Q10–Q9/Q18, resulting in an uneven transfer function of the folding amplifier 100. This effect produces errors that appear as random offsets in the output of the amplifier 100.

Figure 3:
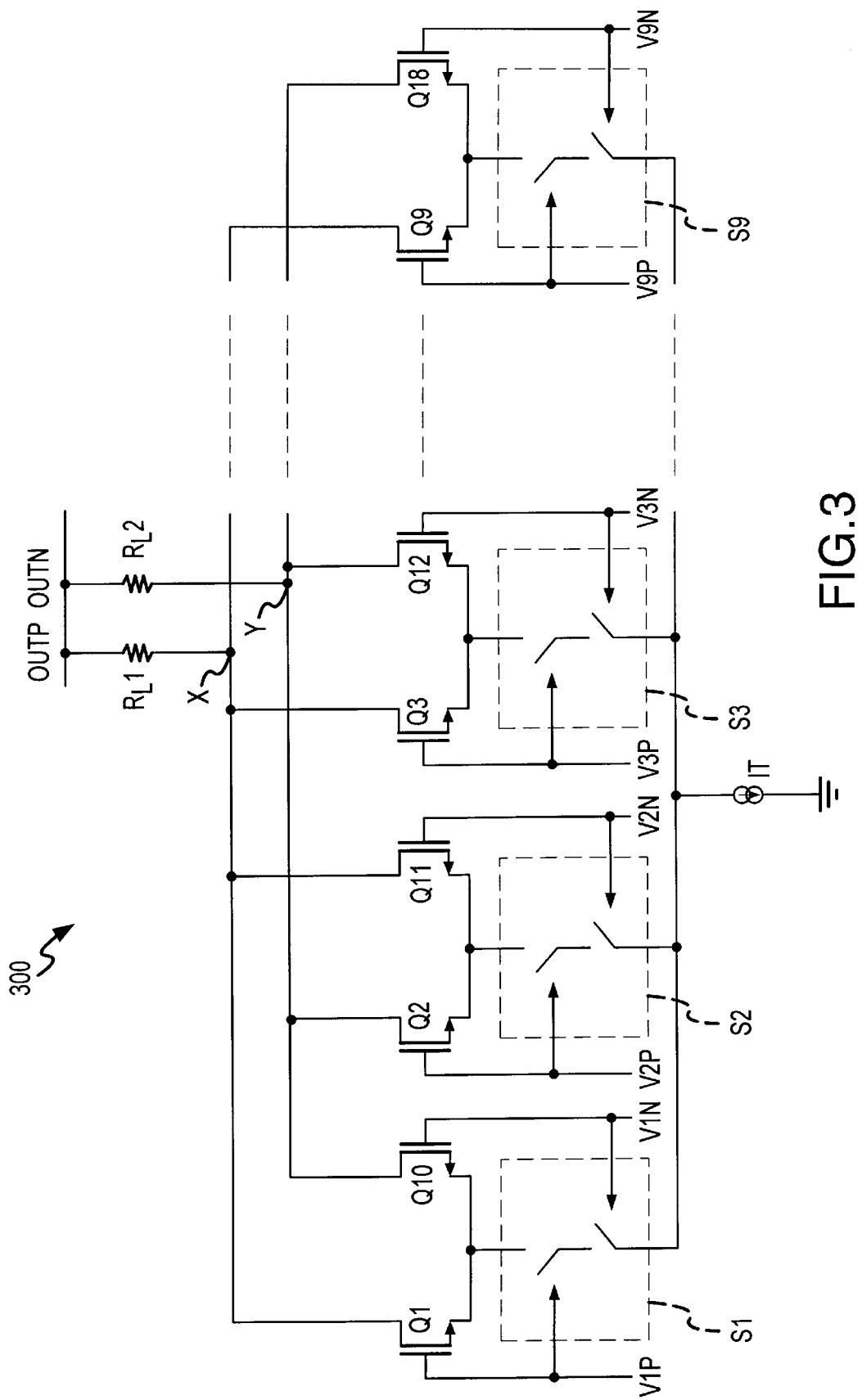
FIG. 3 is a schematic diagram of a folding amplifier in accordance with the present invention.

FIG. 3 is a schematic diagram of a folding amplifier 300 in accordance with the present invention. The inputs to folding amplifier 300 include nine differential inputs $V_1P/V_1N$ through $V_9P/V_9N$, each of which has a value of $\pm(V_{in}-Vref_n)$, where $V_{in}$ is the input signal, and $Vref_n$ is the reference voltage signal for a given differential transistor pair (Q1/Q10, Q2/Q11, . . . Q9/Q18). Each differential pair processes the difference between $V_xP$ and $V_xN$ to produce output currents which are summed at nodes X and Y. Load resistors $R_L1$ and $R_L2$ serve as current to voltage converters, providing output signals at nodes OUTP and OUTN, respectively.

Each differential pair Q1/Q10–Q9/Q18 includes a first transistor having a gate electrode coupled to one side, VnP, of a differential input, and a second transistor having a gate electrode coupled to the other side, VnN, of the differential input. The drain electrode of the first transistor Q1-Q9 of each consecutive differential pair is coupled alternately to the first summing node X and the second summing node Y. The drain electrode of the second transistor Q10-Q18 of each consecutive differential pair is coupled alternately to the second summing node Y and the first summing node X. As described thus far, the configuration of folding amplifier 300 is identical to that of amplifier circuit 100. However, in the folding amplifier 300 of the present invention, the source electrodes of the first and second transistors in each consecutive differential pair Qn/Q(n+9) are interconnected and coupled to one side of a corresponding switch Sn; i.e., source electrodes Q1/Q10 are coupled to switch S1; source electrodes Q2/Q11 are coupled to switch S2, etc. Each switch S1–S9 is controlled by its respective inputs signals, $V_1P/V_1N$–$V_9P/V_9N$, to control the steering of the tail current IT to the active differential pair. Therefore, in the present folding amplifier 300, a single tail current IT is used to service all differentially coupled transistor pairs in the amplifier.

The input signal $V_nP/V_nN$ to a given differential pair is used to switch the tail current IT to that specific differential pair, and thus determines the amount of current allowed into that pair. When a differential pair is fully switched in either direction, the associated switch Sn is open. As a change in the voltage differential of the differential input signal $V_nP/V_nN$ applied to a given differential pair Qn/Q(n+9) causes the pair to pass through its active region, the switch Sn connected to the pair closes to allow current to be conducted through that pair. The switches do not function as simple ON-OFF switches, rather, they are analog switches which turn on or off gradually as a function of the voltage differential between $V_nP$ and $V_nN$.

Since the folding amplifier 300 of the present invention greatly reduces the dc current-to-signal ratio as compared to prior art folding amplifiers, no current subtraction is implemented by the amplifier 300. Therefore, amplifier 300 does not require the current sources Isub1 and Isub2 typically employed by prior art folding amplifiers to offset the high dc current flowing in the load for a given signal.

Figure 4:
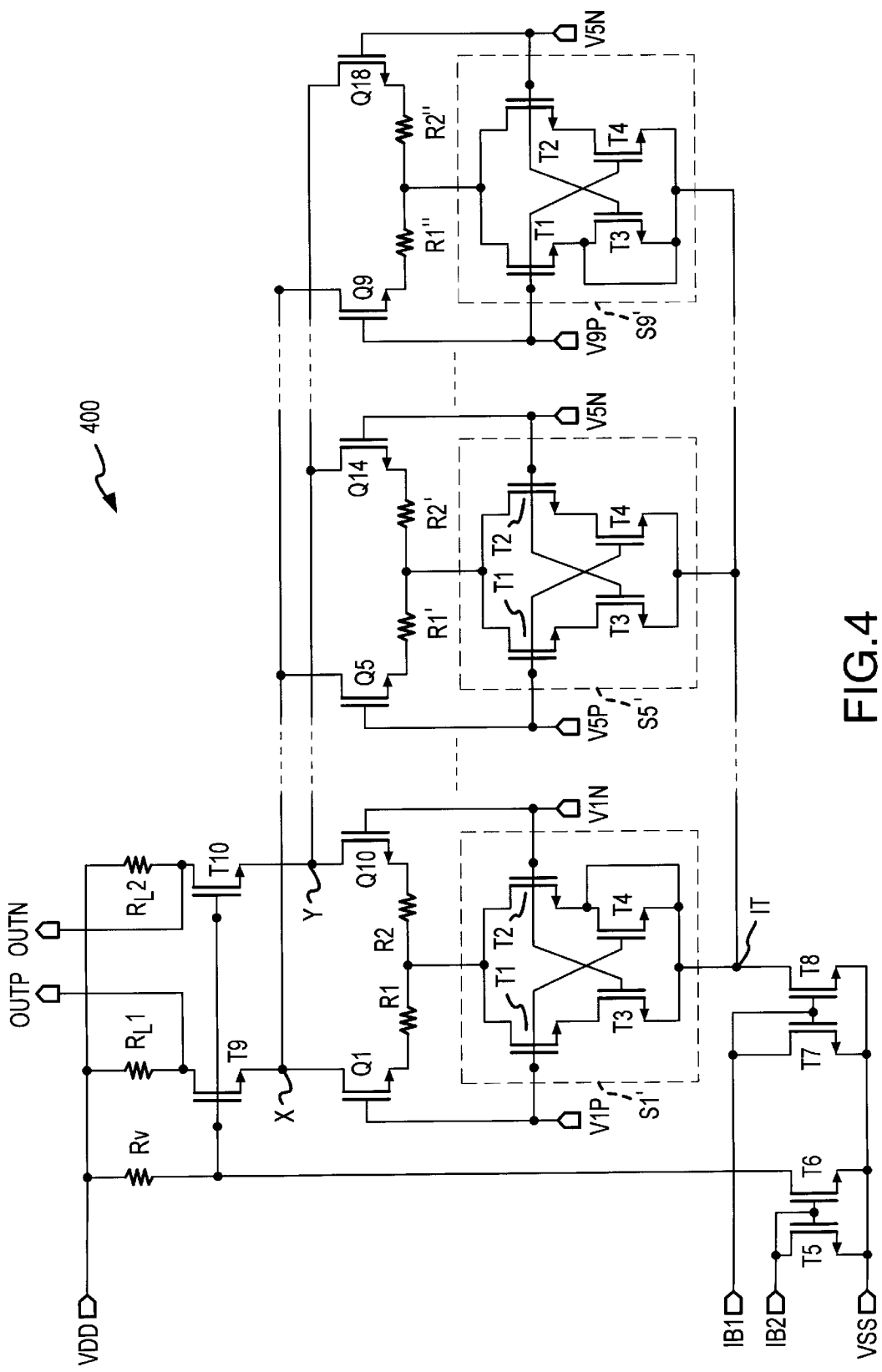
FIG. 4 is a schematic diagram of a folding amplifier in accordance with an exemplary embodiment of the present invention.

FIG. 4 is a schematic diagram of a folding amplifier in accordance with an exemplary embodiment of the present invention. The circuit of FIG. 4 operates identically to the circuit of FIG. 3, with the exception of the two end switches S1' and S9', which are configured to provide a path for the tail current IT when the input signal is out of range, as explained below. FIG. 4 also includes circuit enhancements to the circuit shown in FIG. 3, including current mirrors T5/T6 and T7/T8, and summing node buffers T9 and T10. Each of the transistors Q1-Q18 and T1–T4 is an NMOS enhancement mode device.

Current is mirrored from transistor T5 to transistor T6 and converted by Rv to provide dc bias voltage for cascode transistors T9 and T10 which provide isolation for summing nodes X and Y, respectively. Summing nodes X and Y have a high capacitance due to the number of devices connected to them, and are isolated from output nodes OUTP and OUTN, which have a large voltage swing at high frequencies, and therefore need to have relatively low capacitance. Providing this isolation (buffering) via a cascode arrangement is well known in the art. Current is mirrored from transistor T7 to transistor T8 to provide dc source current IT. Inputs IB1 and IB2 supply bias current to current mirrors T7/T8 and T5/T6, respectively.

In the circuit of FIG. 4, each folding stage (each differential transistor pair Q1/Q10–Q9/Q18) is supplied with a fully differential input voltage of the form VnP, VnN=$\pm(V_{in}-Vref_n)$, where $V_{in}$ is the input signal, and $Vref_n$ is the reference voltage signal for a given stage. The differential inputs are generated by pre-processing circuitry (not shown) well-known in the art. A progressively increasing reference voltage is supplied to the pre-processing circuitry for each successive stage in order to generate a differential input to that stage which ensures that only one differential pair is in its balanced condition at any one time.

Switches S1'–S9' are configured so that a given switch Sn' will be in an ON condition when the associated differential pair Qn/Q(n+9) is in its balanced condition. Therefore, when a differential pair is in a balanced condition, the associated switch Sn' is turned on, and tail current IT is routed primarily through that differential pair only. Specifically, for VnP≈VnN, transistors T1 through T4 are turned ON, so that current can flow from current source T8 to a given differential pair Qn/Q(n+9).

As the input signal Vin increases, the corresponding change in the differential input VnP, VnN to the differential pair Qn/Q(n+9) causes the pair to switch away from its balanced point, thus increasing its tail impedance, while the tail impedance of the adjacent differential pair Q(n+1)/Q(n+10) decreases. Specifically, for VnP <<VnN, transistors T1 and T4 are turned OFF, so there is no current path through which current can flow from current source T8 to a given differential pair Qn/Q(n+9). Therefore, the tail current IT is steered from one differential pair to another according to the value of the input signal. The tail current IT is thus shared between all of the folding stages (differential pairs) according to the ratio of impedances $Zt_n$, where n=1, 2, . . . F, and Zt is the impedance between each differential pair common node (the interconnection point between each of the two source degeneration resistor pairs R1/R2) and the tail current source IT. It should be noted that resistor pairs R1/R2 function to extend the linear range of the differential transistor pairs, and are optional insofar as operation of the present invention is concerned.

In the situation wherein the input signal is out of range of all stages of the folding amplifier, all differential pairs are switched to an OFF condition. In this case, tail current IT must have a path, or the tail (i.e., current source transistor T8) will be forced into a condition from which it is slow to recover. To solve this problem, each end differential pair [Q1/Q10]/[Q9/Q18] is connected to a corresponding switch S1'/S9' which functions to allow tail current IT to continue to flow in one of the two end differential pairs [Q1/Q10]/

[Q9/Q18] when input signal $V_{in}$ goes out of range with respect to that particular differential pair. More specifically, transistor T4 in end switch S1' is bypassed so that current can flow from current source T8 to differential pair Q1/Q10 whenever transistor T2 is turned ON, i.e., when V1N≧V1P. Correspondingly, transistor T3 in end switch S9' is bypassed so that current can flow from current source T8 to differential pair Q9/Q18 whenever transistor T1 is turned ON, i.e., when V1P≧V1N. The switch sizes (device dimensions of transistors T1–T4) in these end switches S1'/S9' are preferably selected to provide the same ON resistance as the resistance of each of the other switches, when the associated differential pair [Q1/Q10]/[Q9/Q18] is in its balanced condition.

The circuit shown in FIG. 4 is preferably fabricated as an integrated circuit using 0.35 μm CMOS technology. In an exemplary embodiment of the present invention, transistors T1–T4 in switches S1'–S9' are n-channel enhancement mode mosfet (nmos) devices. Transistors T1–T4 in switches S1'–S9' have a channel width of 8 μm and a length of 0.35 μm, with the exception of transistors T2 and T1 in end switches S1 and S9, respectively, which have a channel width of 4 μm. These end switch transistors are twice as resistive as the other switch transistors in order to compensate for the fact that the adjacent transistors (T4 and T3 in respective switches S1 and S9) have been shorted. Therefore, by doubling the resistance of each of these devices, the resistance of all paths in the ON condition is made equal.

It should be noted that the circuit of FIG. 4 may be implemented with any number of switches Sn' commensurate with the number of folding stages in other embodiments of the present folding amplifier, where n is the number of stages appropriate for a given application. In addition, transistors T1–T4 may be fabricated using any suitable technology which allows the transistors to provide the switching function described with reference to FIG. 4.

It is to be understood that the claimed invention is not limited to the description of the preferred embodiment, but encompasses other modifications and alterations within the scope and spirit of the inventive concept. It should be noted that the folding amplifier of the present invention is not limited to use in A/D converters, but may also be used in any electronic circuit requiring the signal characteristics of a folding amplifier.

I claim:

1. A folding amplifier comprising:
   a plurality of consecutive folding stages, each of the stages comprising a differentially coupled transistor pair to which is applied a differential signal consisting of the sum and difference of an input signal and a reference voltage which increases progressively for each successive one of said stages, thereby allowing no more than one said transistor pair to be in a balanced condition at any one time; and
   tail current switching means comprising:
      a single tail current input; and
      a plurality of switches, each of which is connected between a corresponding said transistor pair and the tail current input, wherein each of the switches is controlled, by the differential signal being applied to the corresponding transistor pair, in such a manner that tail current applied to the tail current input is routed primarily through the one of said switches connected to the transistor pair which is in said balanced condition.

2. The folding amplifier of claim 1, wherein said differential signal comprises the input signal and the reference voltage.

3. The folding amplifier of claim 1, wherein the differential signal received by each of the stages comprises said input signal and a reference voltage which increases progressively for each successive stage.

4. The folding amplifier of claim 1, wherein each of the switches connected to one of the stages at each end of the amplifier is configured to allow the tail current to continue to flow through said one of the stages when the input signal goes out of range with respect to said one of the stages.

5. The folding amplifier of claim 1, wherein each of the switches comprises:
   a first transistor and a second transistor each having a drain electrode coupled to the tail current input point of the corresponding transistor pair;
   wherein a first side of said differential signal is applied to the gate electrode of the first transistor, and a second side of said differential signal is applied to the gate electrode of the second transistor; and
   a third transistor and a fourth transistor each having a source electrode coupled to the tail current input;
   wherein a first side of said differential signal is applied to the gate electrode of the fourth transistor, and a second side of said differential signal is applied to the gate electrode of the third transistor; and
   wherein the drain electrode of the third transistor is coupled to the source electrode of the first transistor, and the drain electrode of the fourth transistor is coupled to the source electrode of the second transistor.

6. The folding amplifier of claim 5, wherein:
   the switch connected to the one of the stages at a first end of the amplifier is configured so that the source electrode and the drain electrode of the fourth transistor are interconnected; and
   the switch connected to the one of the stages at a second end of the amplifier is configured so that the source electrode and the drain electrode of the third transistor are interconnected.

7. A method for generating a folding output signal across a first summing node and a second summing node in response to a input signal Vin having an increasing voltage level, the method comprising:
   applying a differential signal to a plurality of consecutive folding stages, each of the stages comprising a differentially coupled transistor pair wherein said differential signal is of the form ±(Vin−Vref), where Vref is a reference voltage whose voltage increases in progressively for each successive one of said stages, thereby allowing only a single said transistor pair to be in a balanced condition at any one time; and
   connecting one of a plurality of switches between the tail current input and each transistor pair, wherein each of the switches is controlled, by the differential signal being applied to the corresponding transistor pair, in such a manner that tail current applied to the tail current input is routed primarily through the one of said switches connected to the transistor pair which is in said balanced condition.

8. The method of claim 7, wherein the differential signal received by each of the stages comprises said input signal and a reference voltage which increases progressively for each successive stage.

9. A folding amplifier comprising:
   a single tail current input for receiving a tail current;

folding means having a plurality of stages, each of which generates a similar output signal seriatim in response to a progressively increasing input signal, wherein a differential signal comprising the sum and difference of a reference voltage and the input signal is applied to each of the stages, and wherein said reference voltage increases progressively for each successive one of the stages, thereby allowing only a single one of the stages to be in a balanced condition at any one time; and switching means, operatively coupled between the folding means and the tail current input, and responsive to said differential signal applied to each of the stages, for switching the tail current between the tail current input and the one of the stages which is in said balanced condition.

10. The folding amplifier of claim 9, wherein the differential signal received by each of the stages comprises said input signal and said reference voltage.

11. The folding amplifier of claim 9, wherein each of the switches connected to one of the stages at each end of the amplifier is configured to allow the tail current to continue to flow through said one of the stages when the input signal goes out of range with respect to said one of the stages.

12. A folding amplifier comprising:

a plurality of folding stages to each of which is applied a differential signal which causes a single one of said stages to be in a balanced condition at any one time;

a single tail current input; and switching means, operatively coupled between each of the folding stages and the tail current input, and responsive to said differential signal applied to each of the stages, for switching the tail current between the tail current input and the one of the stages which is in said balanced condition.

13. In a folding amplifier for generating an output signal across a first summing node and a second summing node in response to an input signal Vin, wherein said amplifier includes a plurality of consecutive folding stages, each of the stages comprising a differentially coupled transistor pair having gate electrodes to which is applied a differential signal of the form ±(Vin−Vref), where Vref is a reference voltage which increases progressively for each successive one of said stages to thereby allow only a single said transistor pair to be in a balanced condition at any one time, wherein the source electrodes of both transistors in each said pair are interconnected at a corresponding tail current input point, and wherein, in each successive one of said stages, the drain electrode of the first transistor in each said transistor pair is coupled alternately to the first summing node and to the second summing node and the drain electrode of the second transistor is coupled alternately to the second summing node and to the first summing node, tail current switching means comprising:

a single tail current input; and a plurality of switches, each of which is connected between the tail current input and the tail current input point of a corresponding transistor pair, each of said switches having two control gate inputs, each of said gate inputs being connected to one side of the differential signal being applied to the corresponding transistor pair;

wherein the differential signal being applied to the single transistor pair which is in said balanced condition causes the corresponding one of said switches connected thereto to allow tail current to flow through the single transistor pair.

14. The tail current switching means of claim 13, wherein said differential signal comprises the sum and difference of the input signal and the reference voltage.

15. The tail current switching means of claim 13, wherein the differential signal received by each of the stages comprises said input signal and the reference voltage.

16. The tail current switching means of claim 13, wherein each of the switches connected to one of the stages at each end of the amplifier is configured to allow the tail current to continue to flow through said one of the stages when the input signal goes out of range with respect to said one of the stages.

17. The tail current switching means of claim 13, wherein each of the switches comprises:

a first transistor and a second transistor each having a drain electrode coupled to the tail current input point of the corresponding transistor pair;

wherein a first side of said differential signal is applied to the gate electrode of the first transistor, and a second side of said differential signal is applied to the gate electrode of the second transistor; and a third transistor and a fourth transistor each having a source electrode coupled to the tail current input;

wherein a first side of said differential signal is applied to the gate electrode of the fourth transistor, and a second side of said differential signal is applied to the gate electrode of the third transistor; and wherein the drain electrode of the third transistor is coupled to the source electrode of the first transistor, and the drain electrode of the fourth transistor is coupled to the source electrode of the second transistor.

18. The tail current switching means of claim 17, wherein:

the switch connected to the one of the stages at a first end of the amplifier is configured so that the source electrode and the drain electrode of the fourth transistor are interconnected; and the switch connected to the one of the stages at a second end of the amplifier is configured so that the source electrode and the drain electrode of the third transistor are interconnected.

* * * * *